United States Patent
Koepsell

(10) Patent No.: US 10,111,324 B2
(45) Date of Patent: Oct. 23, 2018

(54) ELECTRICAL COMPONENT

(71) Applicant: Johnson Electric S.A., Murten (CH)

(72) Inventor: Martin Koepsell, Ennepetal (DE)

(73) Assignee: JOHNSON ELECTRIC S.A., Murten (CH)

( * ) Notice: Subject to any disclaimer, the term of this patent is extended or adjusted under 35 U.S.C. 154(b) by 436 days.

(21) Appl. No.: 15/139,935

(22) Filed: Apr. 27, 2016

(65) Prior Publication Data

US 2016/0322887 A1    Nov. 3, 2016

(30) Foreign Application Priority Data

Apr. 28, 2015    (DE) .................. 10 2015 106 518

(51) Int. Cl.
*H05K 1/02*    (2006.01)
*H02K 5/22*    (2006.01)

(52) U.S. Cl.
CPC ............ *H05K 1/028* (2013.01); *H02K 5/225* (2013.01)

(58) Field of Classification Search
USPC .......................... 361/748, 720, 749; 174/250
See application file for complete search history.

(56) References Cited

U.S. PATENT DOCUMENTS

| | | | |
|---|---|---|---|
| 7,188,776 B2 * | 3/2007 | Schumacher .......... | B41M 3/144 235/491 |
| 9,742,240 B2 * | 8/2017 | Katada ................ | H02K 5/225 |
| 2014/0357102 A1 | 12/2014 | Koepsell | |

FOREIGN PATENT DOCUMENTS

| | | |
|---|---|---|
| CN | 203933209 U | 11/2014 |
| JP | 2002096025 A | 4/2002 |
| KR | 20120015525 A | 2/2012 |

* cited by examiner

*Primary Examiner* — Andargie M Aychillhum
(74) *Attorney, Agent, or Firm* — Muncy, Geissler, Olds & Lowe, P.C.

(57) ABSTRACT

An electrical component has a flexible support element with a non-conductive base layer having conductor paths. The support element has a plurality of terminal regions with contact elements for making electrical connections to further electrical or electronic components. For direct contacting to a second electrical component provided with two slot-shaped contact openings, the flexible support element is folded in at least one terminal region to form two blade-shaped, sufficiently stiff contact elements rising from the support element, so that an electrical connection is achieved by pressing the folded contact elements into the slot-shaped contact openings of the second electrical component.

20 Claims, 5 Drawing Sheets

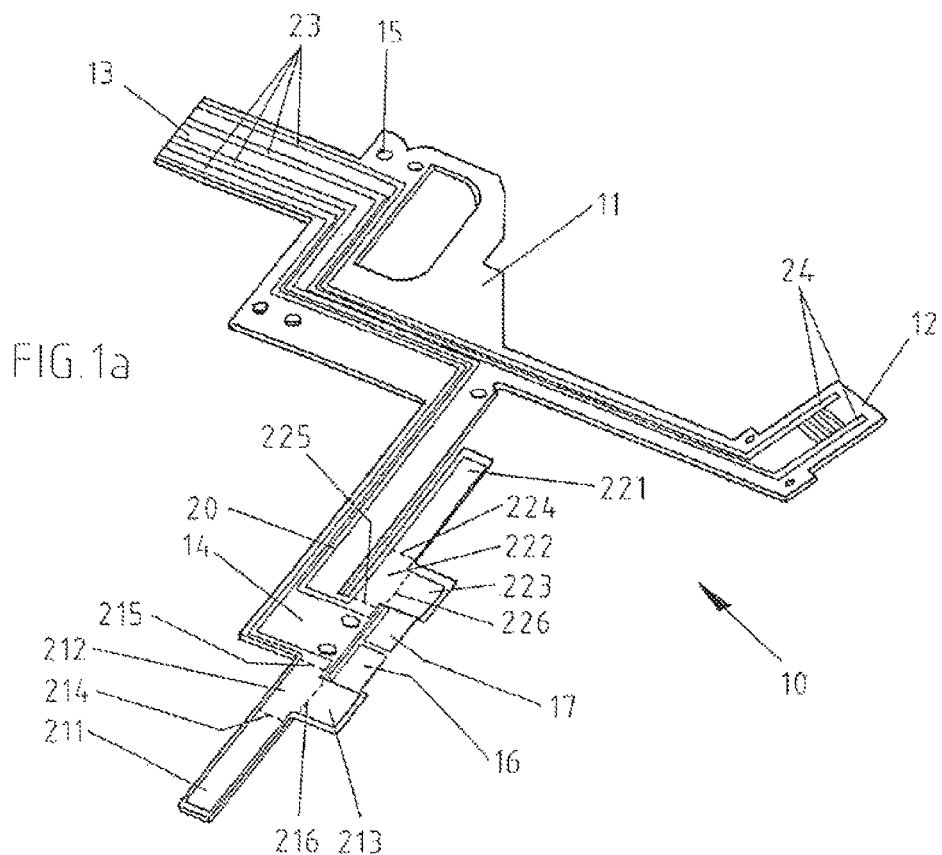
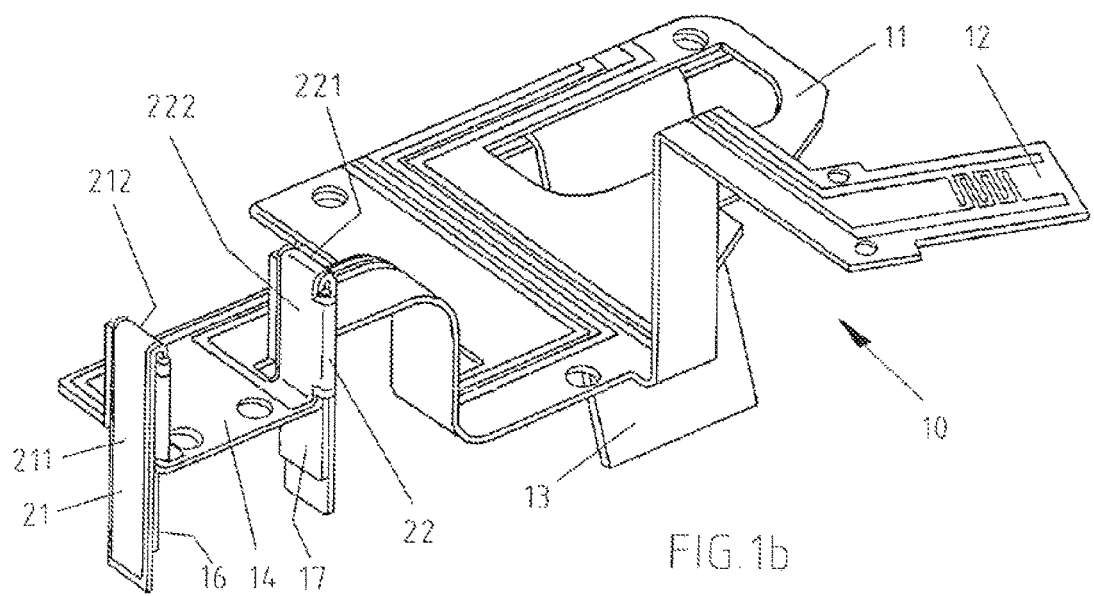

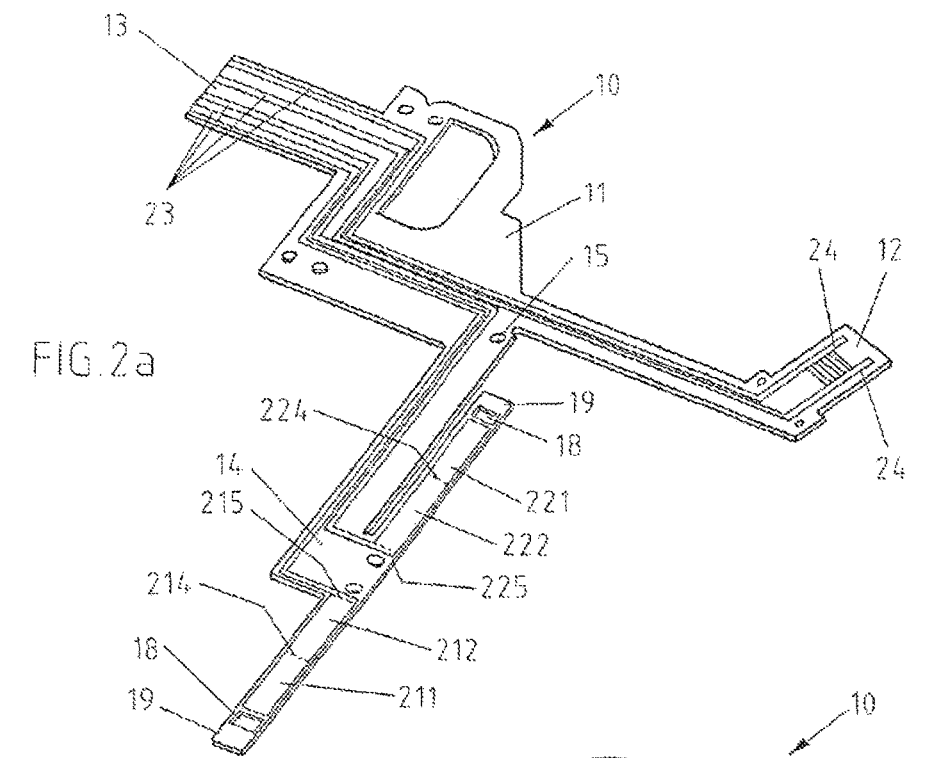
FIG.2a
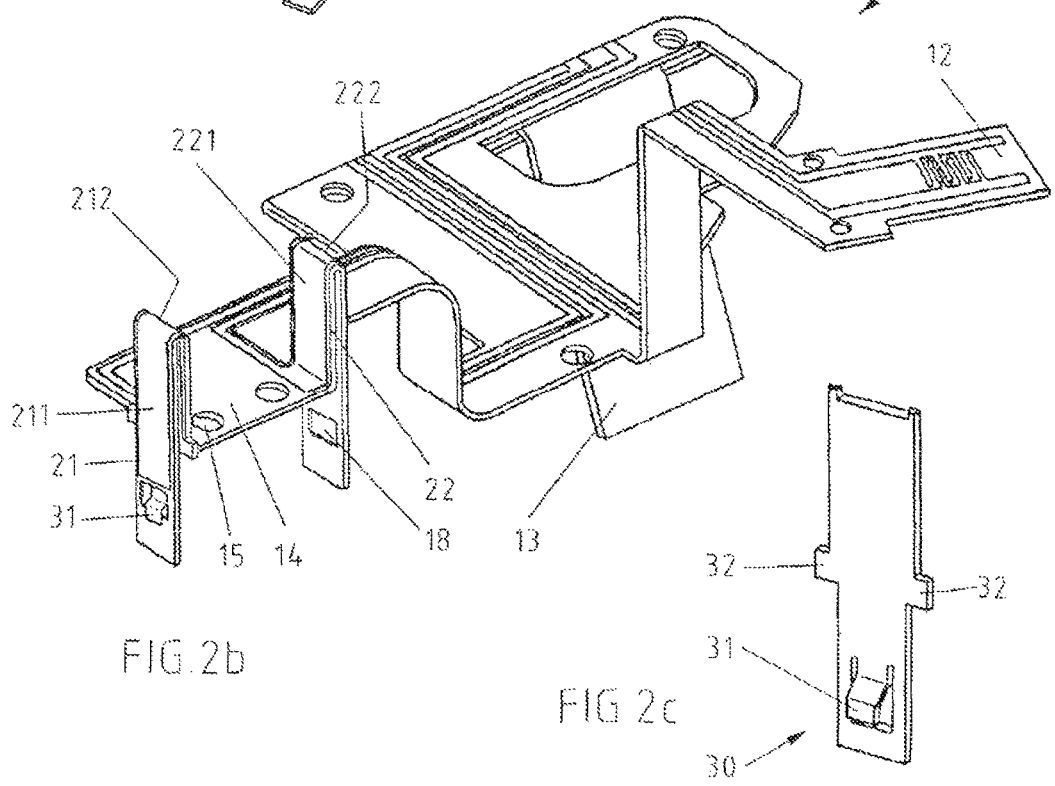
FIG.2b
FIG.2c

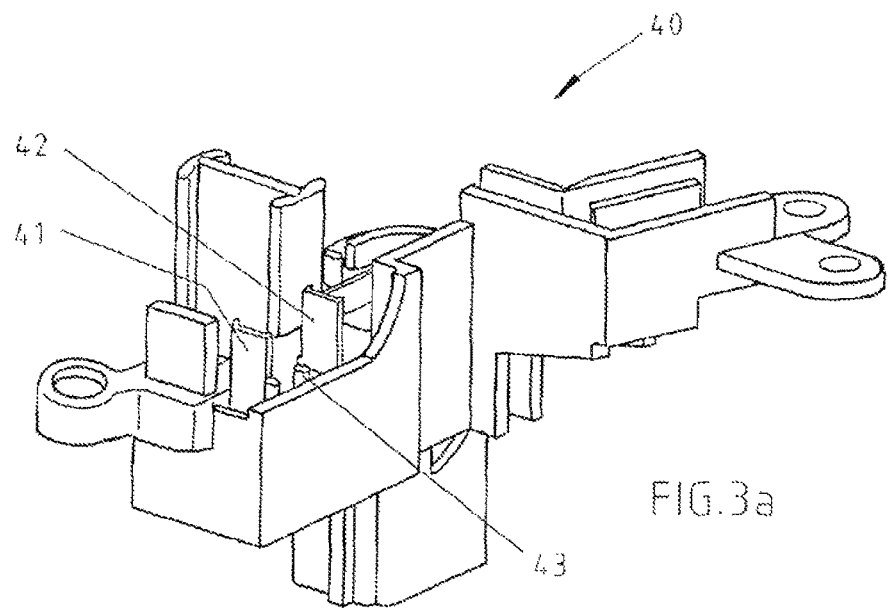
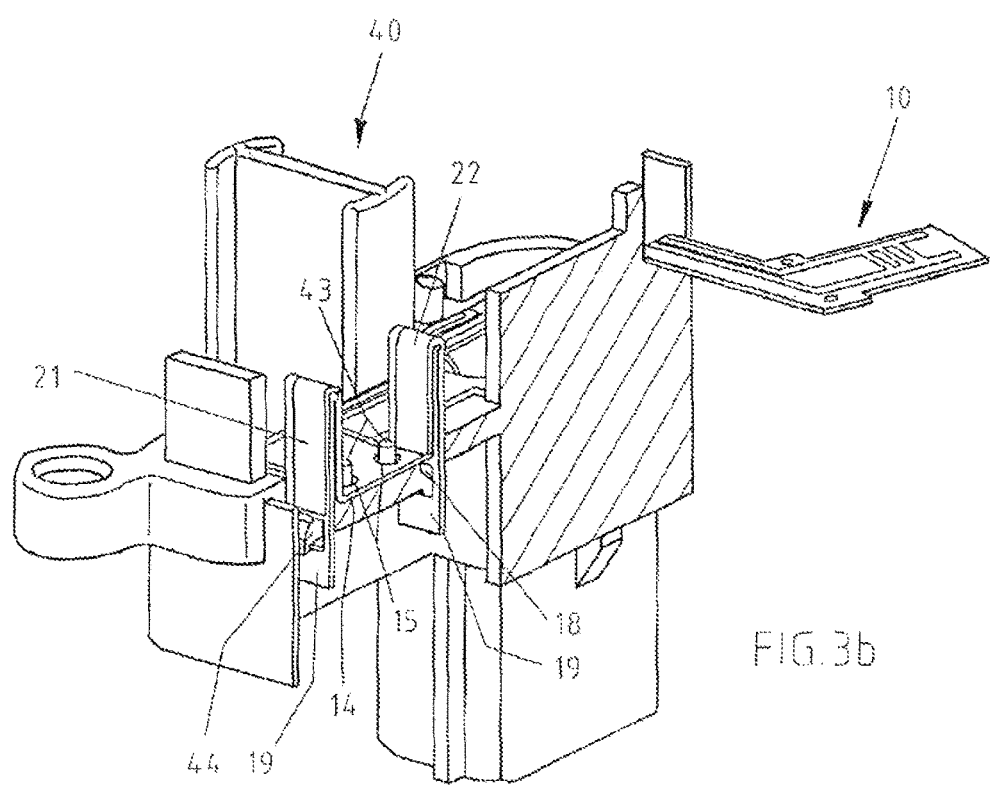

ELECTRICAL COMPONENT

CROSS REFERENCE TO RELATED APPLICATIONS

This non-provisional patent application claims priority under 35 U.S.C. § 119(a) from Patent Application No. 10 2015 106 518.5 filed in Germany on Apr. 28, 2015, the entire contents of which are hereby incorporated by reference.

FIELD OF THE INVENTION

This invention relates to an electrical component having a flexible support element with at least one non-conductive layer with conductor paths on at least one side thereof. The support element has a plurality of terminal regions, into which the conductor paths form contact elements for the electrical connection to further electrical or electronic components.

BACKGROUND OF THE INVENTION

It is necessary in various applications to connect an electric motor to a compact or flexible circuit carrier, in order to connect the electric motor to further electrical components. In automobiles, for example, electric motors are to be found in door locks, window lifters, sunroofs and other automotive components. These motors must be electrically connected to the associated electrical conductors of a circuit carrier. It is known, on the one hand, to lay and to attach metallic, electrical conductors to a deformed plastic component carrier. For insulation, these electrical conductors are embedded in a plastic resin. Furthermore, in US2014/3571.02(A1), flexible foil conductors are known that can be adapted to the shape of a component carrier. Two-part plug-in connections are used to connect the aforementioned circuit earlier to an electric motor. The electric motor has slot-shaped openings, in which there are resilient contacts. Blade-shaped contacts, so-called blade terminals, are mounted on the circuit carriers. These terminals are separate items that are attached to the circuit carrier and electrically connected by means of different methods. Known methods are, for example, soldering, SMD soldering, soldering with laser, crimping, gluing and ultrasonic welding. In particular, the soldering and welding methods lead to a severe thermal stress of the circuit carrier, namely in the region of the connection of the circuit carrier to the terminals.

SUMMARY OF THE INVENTION

Hence there is a desire for an electrical component having a flexible support element, which has blade-shaped contact elements and can be produced without thermal stress of the component.

The electrical component according to the invention comprises a flexible support element with at least one non-conductive layer and on this layer at least on one side conductor paths. The electrical component is used for the electrical connection of various electrical and electronic components. The flexible support element has, in accordance with the intended use, a plurality of terminal regions and in these terminal regions the conductor paths form contact elements for connection to the other electrical components, such as, for example, electrical switches, electrical connectors and, in particular, electric motors. For the direct contacting of the component according to the invention with an electrical component, which has two slot-shaped contact openings, for example, an electric motor with its two slot-shaped contact openings, this terminal region is accordingly designed for connection to such a component. Unlike the prior art, where additional contact elements (terminals) are connected to the conductor paths via thermal processes, in the electrical component according to the invention the contact elements are formed from the support element itself Blade-shaped contact elements are formed on the support element by folding. The blade-shaped folded contact elements can be formed sufficiently stiff that they can be inserted by pressing into the slot-shaped openings, for example, of an electric motor, and ensure a secure electrical connection with the resilient contacts provided in the slot-shaped openings. The new blade-shaped contact elements on the support element are formed by contact surfaces that represent a widening of the conductor paths extending into the terminal region. On the unfolded support element these contact surfaces lie adjacent to each other in a plane. Through folding, the contact surfaces are moved in different directions and after folding are arranged variously aligned, so that at least two contact surfaces form the side surfaces of the blade-shaped, folded contact element rising from the support element.

To stiffen the folded contact elements, various measures are conceivable. The stiffener can on the one hand be made from the flexible support element itself by folding of contact surfaces and/or surfaces of the non-conductive layer as support surfaces. On the other hand, an additional stiffening element maybe provided. Such an additional stiffening element can be a separate, flat stiffening element, about which the contact surfaces for the folded contact elements are folded around. Such a separate stiffening element can also be part of a component carrier, with which the electrical component according to the invention is connected for use.

Accordingly, in one aspect thereof, the present invention provides an electrical component comprising a flexible support element with at least one non-conductive layer and conductor paths formed on at least one side of the at least one non-conductive layer, wherein the support element has a plurality of terminal regions and in these terminal regions the conductor paths form contact elements for connection to further electrical or electronic components, and wherein for direct contacting of a further electrical component provided with two slot-shaped contact openings, the flexible support element with its conductor paths is folded in at least one terminal region to form two blade-shaped contact elements rising from the support element, the folded contact elements are sufficiently stiff that an electrical connection is achievable by pressing the folded contact elements into the slot-shaped openings of the further electrical component.

Preferably, the conductor paths in the terminal region of the folded contact elements are widened to form contact surfaces, wherein the contact surfaces are oriented differently after folding.

Preferably, to stiffen the folded contact elements, contact surfaces of the conductor paths and/or regions of the non-conductive layer are also folded and serve as support surfaces.

Preferably, a folding aid is provided at fold lines along which the flexible support element is folded.

Preferably, the folding aid is: a recess in the conductive layer; a taper of the conductive layer an embossing and/or a locally reduced thickness of the non-conductive layer.

Alternatively, the contact surfaces are folded around a separate flat stiffening element, for stiffening of the folded contact elements.

Preferably, the stiffening element is held on the contact elements by a positive and/or non-positive connection.

Preferably, the stiffening element has a clamp, which engages in a recess at the free end of the folded contact elements.

Preferably, the flexible support element has conductor paths on only one side and a bent terminal region is provided with contact elements for rear-side electrical connection to an additional electrical component.

Preferably, the flexible support element has a terminal region with contact elements, which are provided for the electrical connection with an electrical switch.

According to a second aspect, the present invention provides a component assembly comprising a component carrier and the electrical component described above, wherein the component carrier is formed of plastic and has stiffening projections which engage between the folded contact surfaces of the folded contact elements and stiffen them.

Preferably, the component carrier adjacent to the stiffening projections has indentations, into which the free ends of the folded contact elements extend.

Preferably, the component carrier has clamping elements in the region of the indentations, which engage the recesses at the free ends of the folded contact elements.

According to a third aspect, the present invention provides a component assembly comprising a component carrier, at least one electrical switch, an electric motor and the electrical component described above, wherein the flexible support element is bent corresponding to the shape of the component carrier and is fixed to the component carrier.

Preferably, the flexible support element and the component carrier are connected to each other via a positive and/or non-positive connection.

Preferably, the connection is a riveted connection or an adhesive :connection.

According to a fourth aspect, the present invention provides an electrical component comprising a flexible support element having a non-conductive base layer, conductor paths formed on the base layer, and a pair of blade-shaped terminals arranged to mate with two slot-shaped contact openings of a further electrical component, wherein each terminal is formed by a folded portion of the base layer and conductor paths to form folded contact elements arranged to be inserted into the slot-shaped contact openings of the further electrical component.

The particular advantage of the invention is that a flexible electrical component with blade-shaped contact elements is made available without an additional contact element being necessary and without an additional contact element being connected to the flexible support element via a thermal connection process, such as, for example, soldering or welding. The manufacture of electrical components comprising flexible support elements is a known method. The additional step of folding of contact elements can be integrated in a simple manner, so that the new electrical components can also be mass-produced in a process. Through the deforming step for forming the blade-shaped contact elements, the new electrical component is not subjected to any thermal stress. Connection process that represent a substantial source of error in the production process can be omitted advantageously. Furthermore, fewer assembly steps are necessary for achieving an electrical connection to the new electrical component.

BRIEF DESCRIPTION OF THE DRAWINGS

A preferred embodiment of the invention will now be described, by way of example only, with reference to figures of the accompanying drawings. in the figures, identical structures, elements or parts that appear in more than one figure are generally labeled with a same reference numeral in all the figures in which they appear. Dimensions of components and features shown in the figures are generally chosen for convenience and clarity of presentation and are not necessarily shown to scale. The figures are listed below.

FIG. 1a shows an electrical component according to the invention before deformation;

FIG. 1b shows the component from FIG. 1a after deformation;

FIG. 2a shows another electrical component according to the invention before deformation;

FIG. 2b shows the component according to FIG. 2a after deformation;

FIG. 2c shows a separate stiffening element;

FIG. 3a shows a perspective view of a component carrier;

FIG. 3b shows a section of the component carrier according to FIG. 3a with the component according to the invention.

DETAILED DESCRIPTION OF THE PREFERRED EMBODIMENTS

Figure 1C:
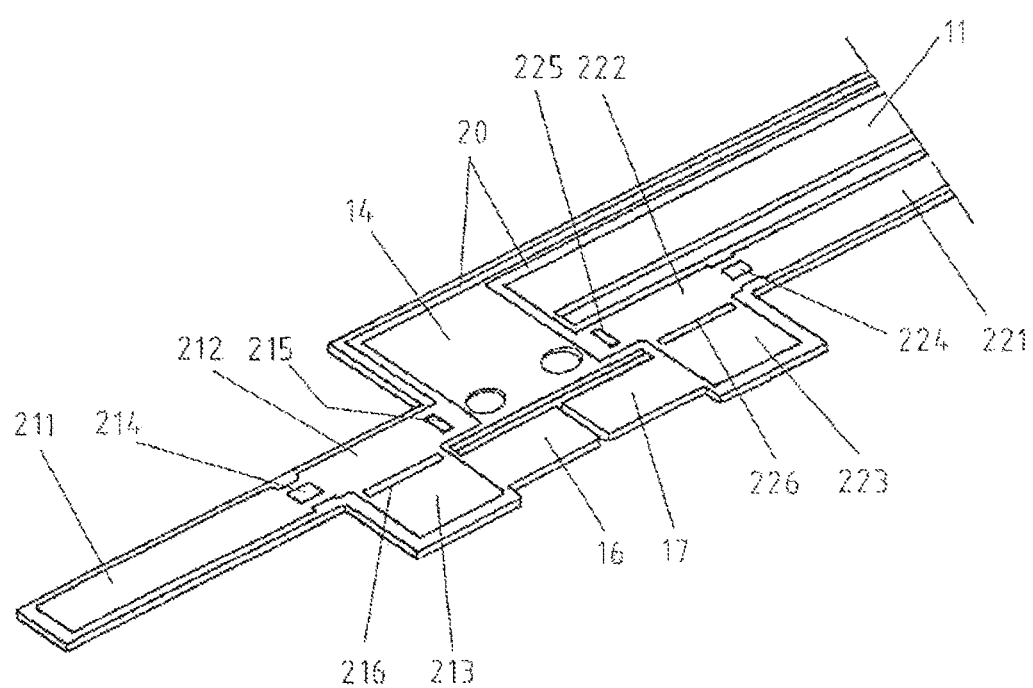
FIG. 1c shows a detailed section of an unfolded terminal area

FIGS. 1a and 1b show a first embodiment of an electrical component according to the invention comprising a flexible support element 10 and FIGS. 2a and 2b show a further embodiment of an electrical component comprising a flexible support element 10. Identical features are provided with the same reference numerals for the various components. The two embodiments are described below.

FIG. 1a shows the electrical component according to the invention as a flat, flexible support element 10, i.e. before the deformation of the support element 10 and before the formation of the folded contact elements 21, 22. Such a deformation also includes in addition to the folding of the contact elements 21, 22 bends of the support element 10 for the adaptation of the support element 10 to the shape of a component carrier. The deformed support element 10 shown in FIG. 1b can be attached in various ways to such a component carrier 40, as, for example, shown in FIG. 3a. The deformed flexible support element 10 is shown in FIG. 1b without the component carrier 40. The flexible support element 10 has a plurality of layers, including a non-conductive layer 11 forming a base layer. In this example, the non-conductive layer 11 is made of polyethylene terephthalate (PET) and has a thickness of 50 µm. A conductive layer in the form of conductor paths 20 is provided on the non-conductive layer 11. The conductor paths 20 of the flexible support element 10 can be, for example, copper conductor paths, which have been applied as a copper layer to the non-conductive layer 11 and exposed by an etching process. However, the conductor paths 20 can also be applied via a printing process to the non-conductive layer 11. In this example, the conductor paths 20 are a silver layer with a thickness of 15 µm, which has been printed in a printing process onto the non-conductive layer 11.

The electrical component is used to connect other electrical components and therefore has a plurality of terminal regions 12, 13, 14. In the mounted flexible support element 10 on a component carrier 40, the contact elements 23 in the terminal region 13 make electrical connection with an electrical connector, the contact elements 24 of the terminal region 12 make electrical connection with an electric switch and the contact elements 21, 22, seen in FIG. 1b, can be inserted into slot-shaped openings of an electric motor, in order to contact resilient contacts in these slot-shaped openings. In the terminal regions 12, 13, 14 the conductor paths 20 are freely accessible. Outside these terminal regions 12, 13, 14 the conductor paths 20 are covered by another non-conductive insulating layer, which is not disclosed in the figures. Such a covering layer may in the same way be a PET layer.

A flexible support element 10 shown in FIG. 1a has, for example, a total thickness of 165 µm when the conductor paths 20 are exposed by an etching process. This total thickness can be reduced to 80 µm when the conductor paths 20 and the corresponding contacts 23, 24 or the contact surfaces of the contacts 21, 22 are applied by a printing process to the non-conductive base layer 11.

FIG. 1b shows the deformed flexible support element 10. So, for example, the terminal region 12 for the switch is arranged in a plane above the ground plane of the flexible support element 10 of FIG. 1a, which was achieved by corresponding bending operations. The terminal region 13 is bent downwards. The contact elements 23 in this terminal region 13 are therefore not visible in FIG. 1b and are located at the back. The blade-shaped contact elements 21, 22, as seen in FIG. 1b, are formed from the flexible support element 10 itself, by multiple folds. In this case, a region 16 or 17 of the non-conductive layer 11 together with the contact surface 213 or 223 is bent around the fold line 216 or 226, so that the two bent portions of the support element 10 are located behind the contact surfaces 212 or 222. Now in each case the laterally projecting wings in the terminal region 14 are on the one hand bent upwards with the visible contact surfaces 211, 212 and on the other hand with the visible contact surfaces 221, 222 around the fold line 215 or 225 and then the upper region of these wings is bent outwards around the fold line 214 or 224 and indeed so far that it abuts the folded package, on the one hand comprising the contact surface 212, 213 and the region 16 and on the other hand comprising the contact surface 222, 223 and the region 17. The regions 16 and 17 of the non-conductive layer 11 are used together with the contact surfaces 211 and 221 of the attachment to a component carrier. This results on the one hand in the contact element 21 with the outwardly facing contact surface 211 and the contact surface 212 arranged on the other side of the contact element 21. The contact element 22 is formed in the same way, such that it has on one side the contact surface 222 and on the other side the contact surface 221. Thus, for the formation of the blade-shaped contact elements 21, 22 rising from the flexible support element 10, no additional blade-shaped contact element (terminal) is to be arranged on the flexible support element 10. The blade-shaped contact elements 21, 22 are produced from the flexible support element 10 itself by folding and the flexible support element 10 has not therefore been subjected to any thermal stress. In this folding process of the flexible support element 10, the contact elements 21, 22 have been stiffened at the same time by surfaces of the non-conductive layer 11, in this example by the regions 16 or 17 but also by contact surfaces, in this example 213 and 223. These contact elements 21, 22 have a sufficient stiffness to achieve an electrical connection by pressing into the slot-shaped openings, of an electric motor, for example. Furthermore, these contact elements 21, 22 are advantageously so pliable that they can lead to a tolerance compensation, since they are formed pliably enough perpendicular to the joining direction.

The folding of regions of the support element 10 to achieve the blade-shaped contact elements 21, 22 can be integrated into a continuous manufacturing process, particularly if the conductive layer, namely the conductor path 20 and the contact surfaces for the contact elements 21, 22, 23, 24 are produced by a printing process. The folding operation can also be supported by the indicated fold lines, particularly in the region of the conductive layer, namely the fold lines 214, 215, 216 and 224, 225, 226, being defined by means of the provided folding aids. Preferably, the folding aid is formed by corresponding recesses at 214, 215, 216, 224, 225, 226 in the conductive layer, as shown in FIG. 1c. Such a folding aid may also be an embossing or a locally reduced thickness in the region of the fold lines 214, 215, 216, 224, 225, 226. This is achievable in a simple manner by cauterization of the conductive layer (subtractive method) or in a printing operation (additive method).

FIG. 2a shows a further flexible support element 10 for an electrical component according to the invention, also in this case before the deformation. The terminal regions 12, 13 with the contact elements 24, 23 are unchanged compared to the embodiment according to FIG. 1a. In the terminal region 14 in this case only two wings are provided, which show the contact surfaces 211, 212 for the contact element 21 and the contact surfaces 221, 222 for the contact element 22. Regions comprising non-conductive material of the support element 10 are in this case not provided. For stiffening of these contact elements 21, 22, a separate stiffening element 30, shown in FIG. 2c, is used. This stiffening element 30 is arranged with its flat end between the bent regions, i.e. the wings provided in the terminal region 14 are folded around this separate stiffening element 30 and pressed flat against each other. The contact surfaces 211, 212 form the outer sides of the contact element 21 and the contact surfaces 221, 222 form the outer sides of the contact element 22. As is evident from FIG. 2a, recesses 18 are provided at the free ends of the wings, which have the contact surfaces 211, 212 or 221, 222. A clamp 31 of the stiffening element 30 engages in these recesses 18 and thus secures the union between the bent wings of the flexible support element 10 and the stiffening element 30. In FIG. 2b the additional stiffening element 30 is used in the left contact element 21, while the separate stiffening element 30 is still to be inserted into the right contact element 22.

The novel electrical components achieved in the two embodiments described comprising a deformed flexible support element. 10, are suitable for mounting on a component carrier 40, for example, for a vehicle door lock or for use in window lifters, a sunroof or locking systems for the bonnet lid and boot lid in vehicles, but also for extraction fans in kitchens or for electrical connections in other electrical household devices, vehicles or agricultural machinery. The component carrier 40, shown for example in FIG. 3a, is an injection molded plastic part. In this case, only the components relating to this invention shall be described in detail The component carrier 40 has two upwardly projecting stiffening projections 41, 42, which in an assembly of the flexible support element 10 serve as stiffening elements for the contact elements 21, 22. This is evident from FIG. 3b, where the component carrier 40 is seen with mounted flexible support: element 10. The front region of the component carrier 40 has been cut away here to be able to show better the connecting region between the component carrier 40 and flexible support element 10 in the terminal region 14. The flexible support element 10 is mechanically fixed to the component carrier 40. For this purpose, the flexible support element 10, as is evident from FIG. 1a or 2a, has a plurality of fixing recesses 15. Two such fixing recesses 15 are also provided in the terminal region 14. The component carrier 40 has a matching fixing post 43 for positioning. At the same time as fixing the support element 10, namely the connection of fixing recesses 15 and fixing posts 43 in various regions of the deformed flexible support element 10, the stiffening projections 41, 42 are also inserted from below into the contact elements 21, 22. The free ends of the contact elements 21, 22 can be accommodated in the indentations on the component carrier 40. A clamping connection can also be provided so that after insertion of the stiffening projections 41, 42, the folded contact elements 21, 22 do not open up again. In the region of the indentations of the component carrier 40 is the clamping element 44, which snaps into the provided recesses 18 at the free end 19 of the contact elements 21, 22.

Figure 3C:
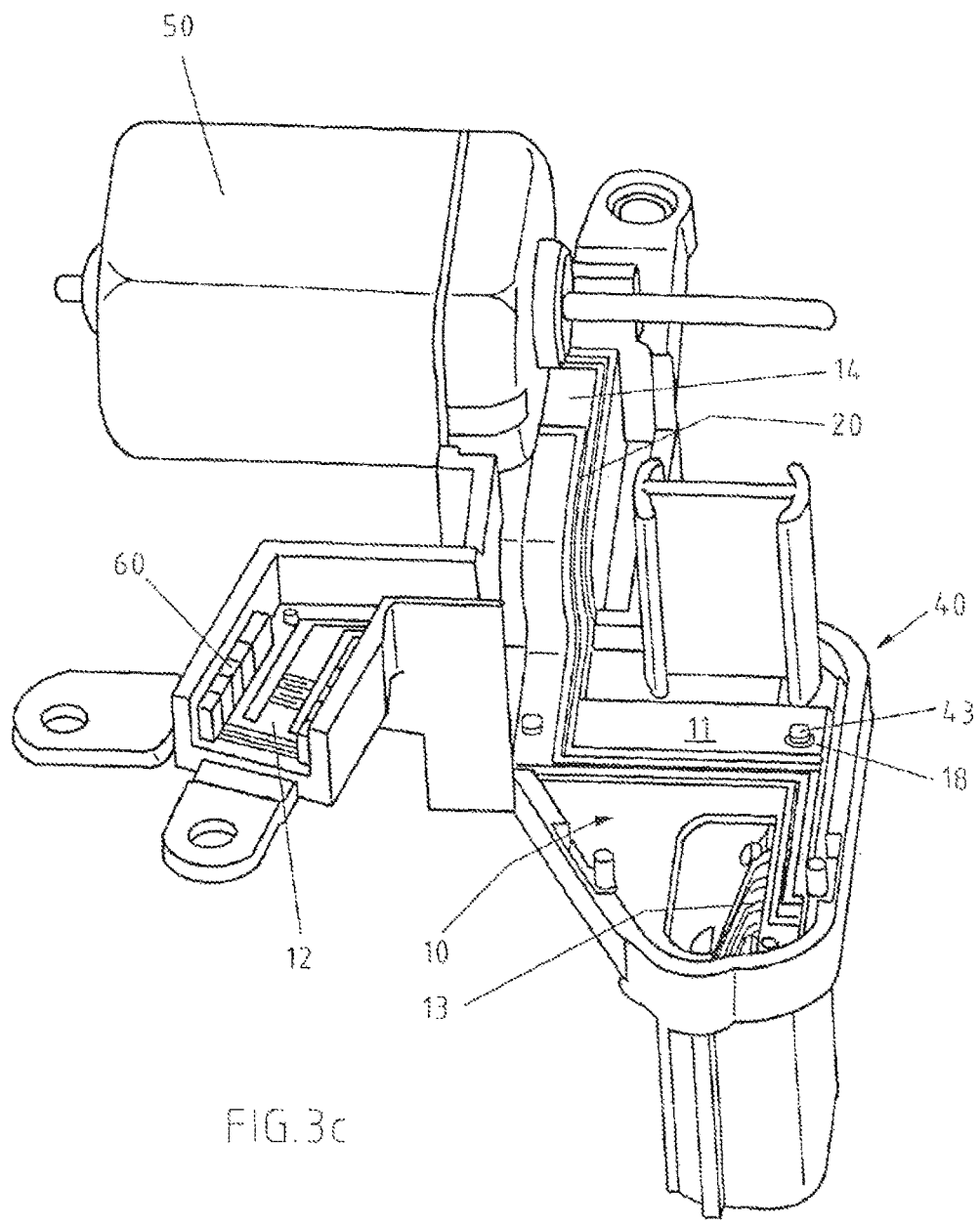
FIG. 3c shows the component carrier of FIGS. 3a and 3b with additional components.

After the assembly of the flexible support element 10, the other electrical components can be mounted. FIG. 3c shows the component carrier 40 with the flexible support element 10, which is connected in the terminal region 12 to an electrical switch 60. In the example in FIG. 3c, only the lower part of the two-part electrical switch 60 is visible. In the terminal region 13, which engages in a tubular terminal piece of the component carrier, an electrical connection can be made with an electrical connector. In the terminal region 14 an electric motor 50 has already been connected. For this purpose, the blade-shaped contact elements 21, 22 engage in slot-shaped openings on the underside of the electric motor, which is not visible.

The electrical component according to the invention, described with reference to the examples, comprising a flexible support element 10, can be adapted for various applications according to the shape of a component carrier 40. The connection with the component carrier 40 can be provided in another known way other than via fixing posts 43, which engage in recesses 18 of the support element 10.

In the description and claims of the present application, each of the verbs "comprise", "include", "contain" and "have", and variations thereof, are used in an inclusive sense, to specify the presence of the stated item or feature but do not preclude the presence of additional items or features.

It is appreciated that certain features of the invention, which are, for clarity, described in the context of separate embodiments, may also be provided in combination in a single embodiment. Conversely, various features of the invention which are, for brevity, described in the context of a single embodiment, may also be provided separately or in any suitable sub-combination.

The embodiments described above are provided by way of example only, and various other modifications will he apparent to persons skilled in the field without departing from the scope of the invention as defined by the appended claims.

The invention claimed is:

1. Electrical component comprising a flexible support element with at least one non-conductive layer and conductor paths formed on at least one side of the at least one non-conductive layer,
   wherein the support element has a plurality of terminal regions and in these terminal regions the conductor paths form contact elements for connection to further electrical or electronic components, and
   wherein for direct contacting of a further electrical component provided with two slot-shaped contact openings, the flexible support element with its conductor paths is folded in at least one terminal region to form two blade-shaped contact elements rising from the support element, the folded contact elements are sufficiently stiff that an electrical connection is achievable by pressing the folded contact elements into the slot-shaped openings of the further electrical component.

2. The electrical component of claim 1, wherein the conductor paths in the terminal region of the folded contact elements are widened to form contact surfaces, wherein the contact surfaces are oriented differently after folding.

3. The electrical component of claim 1, wherein for stiffening of the folded contact elements, contact surfaces of the conductor paths and/or regions of the non-conductive layer are also folded and serve as support surfaces.

4. The electrical component of claim 1, wherein a folding aid is provided at fold lines along which the flexible support element is folded.

5. The electrical component of claim 4, wherein the folding aid is: a recess in the conductive layer; a taper of the conductive layer; an embossing and/or a locally reduced thickness of the non-conductive layer.

6. The electrical component of claim 1, wherein the contact surfaces are folded around a separate flat stiffening element, for stiffening of the folded contact elements.

7. The electrical component of claim 6, wherein the stiffening element is held on the contact elements by a positive and/or non-positive connection.

8. The electrical component of claim 6, wherein the stiffening element has a clamp, which engages in a recess at the free end of the folded contact elements.

9. The electrical component of claim 1, wherein the flexible support element has conductor paths on only one side and a bent terminal region is provided with contact elements for rear-side electrical connection to an additional electrical component.

10. The electrical component of claim 1, wherein the flexible support element has a terminal region with contact elements, which are provided for the electrical connection with an electrical switch.

11. Component assembly comprising a component carrier and the electrical component of claim 1, wherein the component carrier is formed of plastic and has stiffening projections which engage between the folded contact surfaces of the folded contact elements and stiffen them.

12. The component assembly of claim 11, wherein the component carrier adjacent to the stiffening projections has indentations, into which the free ends of the folded contact elements extend.

13. The component assembly of claim 12, wherein the component carrier has clamping elements in the region of the indentations, which engage the recesses at the free ends of the folded contact elements.

14. The component assembly of claim 11, wherein the flexible support element and the component carrier are connected to each other via a positive and/or non-positive connection.

15. The component assembly of claim 14, wherein the connection is a riveted connection or an adhesive connection.

16. Component assembly comprising a component carrier, at least one electrical switch, an electric motor and the electrical component of claim 1, wherein the flexible support element is bent corresponding to the shape of the component carrier and is fixed to the component carrier.

17. The component assembly of claim 16, wherein the flexible support element and the component carrier are connected to each other via a positive and/or non-positive connection.

18. The component assembly of claim 17, wherein the connection is a riveted connection or an adhesive connection.

19. Electrical component comprising a flexible support element having a non-conductive base layer, conductor paths formed on the base layer, and a pair of blade-shaped terminals arranged to mate with two slot-shaped contact openings of a further electrical component,
   wherein each terminal is formed by a folded portion of the base layer and conductor paths to form folded contact elements arranged to be inserted into the slot-shaped contact openings of the further electrical component.

20. The electrical component of claim 19, wherein the further electrical component is an electric motor.

* * * * *